United States Patent
Schon

(10) Patent No.: US 9,157,687 B2
(45) Date of Patent: *Oct. 13, 2015

(54) HEAT PIPES INCORPORATING MICROCHANNEL HEAT EXCHANGERS

(75) Inventor: Steven G. Schon, Strafford, PA (US)

(73) Assignee: QCIP Holdings, LLC, Strafford, PA (US)

(*) Notice: Subject to any disclaimer, the term of this patent is extended or adjusted under 35 U.S.C. 154(b) by 571 days.

This patent is subject to a terminal disclaimer.

(21) Appl. No.: 12/291,544

(22) Filed: Nov. 10, 2008

(65) Prior Publication Data

US 2009/0229794 A1 Sep. 17, 2009

Related U.S. Application Data

(60) Provisional application No. 61/017,198, filed on Dec. 28, 2007.

(51) Int. Cl.
*F28D 15/00* (2006.01)
*F28D 15/04* (2006.01)
(Continued)

(52) U.S. Cl.
CPC .......... *F28D 15/043* (2013.01); *F24J 2/12* (2013.01); *F24J 2/14* (2013.01); *F24J 2/32* (2013.01); *F28D 15/0266* (2013.01);
(Continued)

(58) Field of Classification Search
CPC .... F24J 2/32; F28D 15/0266; F28D 15/0275; F28D 15/043; F28D 2015/0225; H01L 31/052; Y02E 10/44

USPC ........ 165/80.4, 80.5, 104.13, 104.14, 104.19, 165/104.21, 104.26, 128, 129, 131, 165, 165/166, 173

See application file for complete search history.

(56) References Cited

U.S. PATENT DOCUMENTS

| | | | |
|---|---|---|---|
| 4,106,952 A | 8/1978 | Kravitz | |
| 4,337,758 A | 7/1982 | Meinel et al. | |

(Continued)

FOREIGN PATENT DOCUMENTS

| | | |
|---|---|---|
| EP | 0212878 A1 | 3/1987 |
| JP | 08-131702 | 5/1996 |

(Continued)

OTHER PUBLICATIONS

Claims from copending U.S. Appl. No. 12/459,393.*

(Continued)

*Primary Examiner* — M. Alexandra Elve
*Assistant Examiner* — Henry Crenshaw
(74) *Attorney, Agent, or Firm* — Kristofer E. Elbing

(57) ABSTRACT

A heat pipe can include a microchannel heat exchanger at the heat absorbing end and another heat exchanger which is optionally also a microchannel heat exchanger at the heat sink end, with one or more pipes flowably connecting the two ends for transporting liquid working fluid to the head absorber and vaporized working fluid to the heat sink. The heat pipes may be used to cool electronic devices with rejection of heat outside an enclosure, and optionally outside a room, containing the electronic devices. The heat pipes may be used to cool photovoltaic or solar collection devices with rejection of heat to ambient air at a distance removed from the photovoltaic devices. Heat pipe systems are disclosed wherein the working fluid is a hydrofluorocarbon or a mono-chlorinated hydrofluoroalkene having a normal boiling point in a range from 10° C. to 80° C.

47 Claims, 13 Drawing Sheets

(51) Int. Cl.
    *F24J 2/12*      (2006.01)
    *F24J 2/14*      (2006.01)
    *F24J 2/32*      (2006.01)
    *H01L 31/052*    (2014.01)
    *F28D 15/02*     (2006.01)

(52) U.S. Cl.
    CPC ......... *F28D 15/0275* (2013.01); *H01L 31/052* (2013.01); *F28D 2015/0225* (2013.01); *Y02E 10/42* (2013.01); *Y02E 10/44* (2013.01); *Y02E 10/45* (2013.01); *Y02E 10/50* (2013.01)

(56) References Cited

U.S. PATENT DOCUMENTS

| | | | |
|---|---|---|---|
| 4,397,303 | A | 8/1983 | Stultz |
| 4,450,472 | A * | 5/1984 | Tuckerman et al. ............ 257/713 |
| 4,955,361 | A | 9/1990 | Sotani et al. |
| 5,274,920 | A * | 1/1994 | Matthews ................ 29/890.039 |
| 5,453,641 | A | 9/1995 | Mundinger et al. |
| 5,778,685 | A * | 7/1998 | Singh et al. ........................ 62/66 |
| 6,216,343 | B1 | 4/2001 | Leland et al. |
| 6,381,135 | B1 * | 4/2002 | Prasher et al. ................ 361/700 |
| 6,415,860 | B1 * | 7/2002 | Kelly et al. ................... 165/148 |
| 6,689,949 | B2 | 2/2004 | Ortabasi |
| 6,698,502 | B1 | 3/2004 | Lee |
| 6,834,712 | B2 | 12/2004 | Parish et al. |
| 6,865,081 | B2 * | 3/2005 | Meyer et al. ................ 361/699 |
| 6,951,243 | B2 | 10/2005 | Nilson et al. |
| 6,991,024 | B2 | 1/2006 | Goodson et al. |
| 7,002,801 | B2 * | 2/2006 | Zeighami et al. ............. 361/700 |
| 7,007,506 | B2 * | 3/2006 | Kubo et al. ..................... 62/515 |
| 7,011,146 | B2 | 3/2006 | Wong |
| 7,017,655 | B2 * | 3/2006 | Wilson et al. ................ 165/80.4 |
| 7,150,312 | B2 | 12/2006 | Parish, IV et al. |
| 7,198,096 | B2 | 4/2007 | Parish, IV et al. |
| 7,234,513 | B2 | 6/2007 | Wong |
| 7,305,843 | B2 | 12/2007 | Quisenberry et al. |
| 7,347,058 | B2 | 3/2008 | Malone |
| 7,626,407 | B2 * | 12/2009 | Kabbani .................. 324/750.03 |
| 2002/0174977 | A1 * | 11/2002 | Low et al. ...................... 165/157 |
| 2002/0195242 | A1 * | 12/2002 | Garner ........................... 165/274 |
| 2004/0188064 | A1 * | 9/2004 | Upadhya et al. ............. 165/80.3 |
| 2004/0250994 | A1 * | 12/2004 | Chordia ........................ 165/80.4 |
| 2005/0061486 | A1 | 3/2005 | Yang |
| 2005/0161205 | A1 * | 7/2005 | Ashe et al. .................... 165/168 |
| 2005/0211417 | A1 * | 9/2005 | Upadhya et al. ............. 165/80.4 |
| 2005/0217837 | A1 * | 10/2005 | Kudija, Jr. .................... 165/165 |
| 2006/0151146 | A1 * | 7/2006 | Chou et al. ...................... 165/10 |
| 2006/0185823 | A1 * | 8/2006 | Thayer et al. ................ 165/80.4 |
| 2006/0185827 | A1 * | 8/2006 | Huang et al. ............. 165/104.25 |
| 2006/0231233 | A1 | 10/2006 | Farid et al. |
| 2006/0254753 | A1 * | 11/2006 | Phillips et al. ................ 165/100 |
| 2006/0283577 | A1 * | 12/2006 | Liu et al. .................. 165/104.26 |
| 2006/0289146 | A1 * | 12/2006 | Wu ............................ 165/104.21 |
| 2006/0289147 | A1 * | 12/2006 | Zuo et al. ................. 165/104.26 |
| 2007/0006994 | A1 * | 1/2007 | Liu et al. .................. 165/104.26 |
| 2007/0121294 | A1 * | 5/2007 | Campbell et al. ............. 361/699 |
| 2007/0197842 | A1 * | 8/2007 | Mukhopadhyay et al. ... 570/155 |
| 2008/0105413 | A1 * | 5/2008 | Peng ........................ 165/104.33 |
| 2008/0164010 | A1 * | 7/2008 | Kang et al. ............... 165/104.26 |
| 2008/0277099 | A1 * | 11/2008 | Takamatsu et al. ...... 165/104.26 |
| 2009/0139693 | A1 | 6/2009 | Qu |

FOREIGN PATENT DOCUMENTS

| | | |
|---|---|---|
| JP | 2008-131702 | 5/1996 |
| KR | 10-2002-0081829 | 10/2002 |
| KR | 10-2002-0081829 A | 10/2002 |
| KR | 10-2005-0095289 | 9/2005 |
| KR | 10-2005-0095289 A | 9/2005 |
| WO | PCT/US2008/01481 | 8/2009 |

OTHER PUBLICATIONS

Introduction to Microfluidics, Tabeling, Patrick, Cheng, and Suelin, Oxford University Press, UK, Feb. 2006.*
Remsburg, Ralph, Advanced Thermal Design of Electronic Equipment, 1998, pp. 245, 276, Springer Publishing, New York.
Matthew L. Wald, Waste Not, Want Not: A New Approach to Solar, New York Times, Oct. 15, 2008.
Eastman, The Heat Pipe, The Scientific American, May 1968, pp. 38-46, vol. 218, No. 5, United States.
HAMDAN and ELNAJJAR, Loop Heat Pipe: Simple Thermodynamic, World Academy of Science, Engineering and Technology, 2009, Issue 52, World Academy of Science.
Matthias Behn, Icebear Systems Atotech Ardex G, 2008, Germany.
PCHEs Compact Heat Exchange, Heatric Brochure, pp. 1-6, Meggitt PLC, Dorset, United Kingdom.
Simulation of Two-Phase Flow and Heat Transfer for Practical Design of Mini- and Micro-Channel Heat Exchangers, Proceedings of the ASME 2011 International Mechanical Engineering Congress & Exposition, IMECE 2011-63637 (Nov. 11-17, 2011).
Simulation of Two-Phase Flow and Heat Transfer in Mini- and Micro-Channels for Concentrating Photovoltaics Cooling, Proceedings of the ASME 2011 5th International Conference on Energy Sustainability, ES2011-54206 (Aug. 7-10, 2011).
International Search Report and Written Opinion (PCT Application No. PCT/US2008/014081, WO2009085307), mailed Aug. 17, 2009.
Amendment U.S. Appl. No. 12/459,391, filed Apr. 2, 2010.
Office Action (U.S. Appl. No. 12/459,393), mailed Jul. 29, 2011.
Reply U.S. Appl. No. 12/459,393, filed Nov. 29, 2011.
Office Action (U.S. Appl. No. 12/459,391), mailed Feb. 29, 2012.
Office Action (U.S. Appl. No. 12/459,393), mailed Jul. 13, 2012.
Amendment U.S. Appl. No. 12/459,391, filed Aug. 29, 2012.
Office Action (Israel Patent Application No. IL206656—translation) mailed fall 2012.
Office Action (Australian Patent Application No. AU2008343788) mailed Sep. 25, 2012.
Office Action (U.S. Appl. No. 12/459,391), mailed Dec. 27, 2012.
Amendment U.S. Appl. No. 12/459,393, filed Jan. 14, 2013.
Reply U.S. Appl. No. 12/459,393, filed Apr. 11, 2013.
Amendment U.S. Appl. No. 12/459,391, filed Apr. 29, 2013.
Office Action (U.S. Appl. No. 12/459,393), mailed Jun. 10, 2013.
Office Action (U.S. Appl. No. 12/459,391), mailed Sep. 4, 2014.
Patent Exam Report (Australia & New Zealand, Patent Application No. 2008343788), Date of Issue Jun. 23, 2014.
Notice of Acceptance (Australian Government, Patent Application No. 2008343788), Date of Issue Jun. 25, 2014.
Search listing of US Patents with inventor Jon Zuo, from USPTO PATFT system.
Mendelson, Edward; 'Free Support ; The answer to your problems may be just a few clicks away.' PC Magazine, 23.6, 76 (Apr. 6, 2004).
Karp, David A.; 'Who you gonna call? We tested five services to see who could solve your hardware and software problems in a pinch.' PC Magazine, 24.16, 95(6) (Sep. 20, 2005).
'Rouchon Industries Receives Editor's Choice Award from TweakTown for New Polaris 120 Heatsink for Intel(R) and AMD(R) Processors,' M2 Communications, from GeneralOneFile (Apr. 19, 2011).
'MSI X79 series mainboards reaches 5GHz under air cooling with Core i73960X Extreme Edition processors for up to 150% gain!' ENP Newswire, from Academic OneFile (Jan. 3, 2012).
Office Action (U.S. Appl. No. 12/459,391), mailed Apr. 9, 2015.
Amendment (U.S. Appl. No. 12/459,391), mailed Mar. 4, 2015.

* cited by examiner

HEAT PIPES INCORPORATING MICROCHANNEL HEAT EXCHANGERS

CROSS REFERENCE TO RELATED APPLICATION

This application claims the benefit under 35 U.S.C. 119(e) of U.S. provisional application Ser. No. 61/017,198 filed Dec. 28, 2007, which is herein incorporated by reference.

BACKGROUND OF THE INVENTION

Heat pipes are used for cooling and transferring heat away from hot objects to a physically separated cooler area or cooling device. Heat pipes may take the form of a single closed tube, or of a pair of tubes or pipes connected in a closed circuit. The full heat pipe system also includes a volatile "working fluid" enclosed in the heat pipe, the evaporation and condensation of which mediates heat transfer from one end of the heat pipe to the other. One end of the tube or closed piping circuit is provided with a means for collecting and absorbing heat (heat absorber) at an elevated temperature, causing the fluid to evaporate. The other end of the tube or piping circuit is provided with a means for rejecting heat (heat sink) at a lower temperature than the hot end. At the heat absorber, the volatile fluid evaporates and absorbs heat; the vapor expands in volume and travels to the heat sink, where it condenses and gives up its heat. The condensed fluid returns to the hot end by gravity or capillary action via a wick, repeating the cycle. The pressure inside the heat pipe rises to that corresponding to the vapor pressure of the working fluid at the fluid boiling temperature inside the heat absorber block.

In a single tube heat pipe, the vapor travels up the core of the tube, and the liquid returns counter-currently along the walls. In a two-pipe configuration, sometimes referred to a thermosyphon, the vapor travels up one pipe, and the liquid returns via the second pipe, which is usually smaller in diameter. Heat pipes have the advantage of very high heat transfer rates, and do not rely on any mechanically moving parts.

An essential consideration in designing heat pipes is the selection of the heat exchangers for the heat absorber and the heat sink. Their characteristics determine the rate at which heat can be transferred away from hot objects or fluids. The rate of heat transfer into the heat absorber, and/or the rate of heat transfer from the heat sink to the cooling medium, is often the limiting factor in the performance of heat pipes, especially if the ratio of the fluid internal surface area to the working fluid volume is relatively small in the absorber or the heat sink Primary considerations in selecting a heat absorber or heat sink configuration are the mechanical design of the heat transfer surfaces (e.g., configuration, material layout and thickness, orientation, etc.), the modes of heat transfer (e.g., conduction and/or convection and/or radiation), and the physical properties (especially the thermal conductivity) of the materials of construction of the heat transfer materials in direct with the working fluid.

Heat pipes have hitherto typically used simple, conventional heat exchange designs for the heat absorber and the heat sink. These include hollow blocks or plates (with a cavity for the working fluid), shell-and-tube exchangers, plate heat exchangers, bare tubes or pipes, and tubes, pipes, or hollow blocks with extended surfaces. However, despite the variety of available configurations, there has still been a need for heat pipes with higher heat transfer rates than those traditionally available.

SUMMARY OF THE INVENTION

In one aspect, the invention provides a heat pipe comprising:

a) a microchannel heat absorber comprising at least one layer defining a plurality of microchannels having a cross-sectional dimension of less than 1000 microns and terminating at a first end thereof in a cool side manifold and at a second end thereof in a warm side manifold, the microchannels adapted to contain a liquid working fluid that absorbs heat and forms a vapor upon flowing therethrough from the first end to the second end, b) a heat sink for receiving and condensing the vapor to reform the liquid working fluid and for discharging the liquid working fluid, and c) one or more pipes flowably connecting the warm side manifold of the heat absorber to the heat sink and flowably connecting the cool side manifold of the heat absorber to the heat sink, wherein the one or more pipes are connected so as to permit simultaneous flow of the vapor from the heat absorber to the heat sink and of the liquid working fluid from the heat sink to the heat absorber when heat is applied to the heat absorber.

In another aspect, the invention provides a heat pipe system including a working fluid contained within a heat pipe. The heat pipe includes:

a) a microchannel heat absorber including at least one layer defining a plurality of parallel microchannels having a largest cross-sectional dimension of less than 1000 microns and terminating at a first end thereof in a cool side manifold and at a second end thereof in a warm side manifold, the microchannels adapted to contain the working fluid as a liquid that absorbs heat and forms a vapor upon flowing there through from the first end to the second end, b) a heat sink for receiving and condensing the vapor to reform the liquid working fluid and for discharging the liquid working fluid, and c) one or more pipes flowably connecting the warm side manifold of the heat absorber to the heat sink and flowably connecting the cool side manifold of the heat absorber to the heat sink, wherein the one or more pipes are connected so as to permit simultaneous flow of the vapor from the heat absorber to the heat sink and of the liquid working fluid from the heat sink to the heat absorber when heat is applied to the heat absorber.

In yet another aspect, the invention provides a method of cooling an electronic device housed inside an enclosure. The method includes
i) providing
a) a microchannel heat absorber including at least one layer defining a plurality of parallel microchannels having a largest cross-sectional dimension of less than 1000 microns and terminating at a first end thereof in a cool side manifold and at a second end thereof in a warm side manifold, the microchannels containing a liquid working fluid that absorbs heat and forms a vapor upon flowing therethrough from the first end to the second end, b) a heat sink for receiving and condensing the vapor to reform the liquid working fluid and for discharging the liquid working fluid, and c) one or more pipes flowably connecting the warm side manifold of the heat absorber to the heat sink and flowably connecting the cool side manifold of the heat absorber to the heat sink, wherein the one or more pipes are connected so as to permit simultaneous flow of the vapor from the heat absorber to the heat sink and of the liquid working fluid from the heat sink to the heat absorber when heat is applied to the heat absorber, ii) installing the microchannel heat absorber inside the enclosure, and iii) installing the heat sink outside the enclosure.

In yet another aspect, the invention provides a method of cooling a photovoltaic device or solar collector, especially such devices wherein the light intensity is amplified by concentrating means. The method includes i) providing a) a microchannel heat absorber including at least one layer defining a plurality of parallel microchannels having a largest cross-sectional dimension of less than 1000 microns and terminating at a first end thereof in a cool side manifold and at a second end thereof in a warm side manifold, the microchannels containing a liquid working fluid that absorbs heat and forms a vapor upon flowing therethrough from the first end to the second end, b) a heat sink for receiving and condensing the vapor to reform the liquid working fluid and for discharging the liquid working fluid, and c) one or more pipes flowably connecting the warm side manifold of the heat absorber to the heat sink and flowably connecting the cool side manifold of the heat absorber to the heat sink, wherein the one or more pipes are connected so as to permit simultaneous flow of the vapor from the heat absorber to the heat sink and of the liquid working fluid from the heat sink to the heat absorber when heat is applied to the heat absorber, ii) installing the microchannel heat absorber in direct contact with the non-illuminated portion of the photovoltaic device, and iii) installing the heat sink at a distance sufficiently removed from the photovoltaic device to allow the heat sink to be rejected to ambient air. The heat sink may be optionally provided with a means for converting the waste heat to additional electricity, e.g. Seebeck-effect type thermo-electric generators, or by low-pressure turbo-generators using a secondary loop of vaporizing and condensing fluid.

In a further aspect, the invention provides a heat pipe system including a working fluid contained within a heat pipe. The heat pipe includes:

a) a heat absorber adapted to contain the working fluid as a liquid that absorbs heat and forms a vapor, b) a heat sink for receiving and condensing the vapor to reform the liquid working fluid and for discharging the liquid working fluid, and c) one or more pipes flowably connecting the heat absorber to the heat sink so as to permit simultaneous flow of the vapor from the heat absorber to the heat sink and of the liquid working fluid from the heat sink to the heat absorber when heat is applied to the heat absorber, wherein the working fluid is a fluorocarbon, a hydrofluorocarbon, a chlorinated fluoroalkene, a chlorinated hydrofluoroalkene, or a mixture thereof having a normal boiling point in a range from 10° C. to 80° C.

In another aspect, the invention features a cooling method that includes:

causing a liquid working fluid to flow through a plurality of microchannels having a cross-sectional dimension to the center of the channel that is about equal to or less than the thermal boundary layer thickness for the working fluid, causing at least some of the working fluid to form a vapor and absorb heat at a first location, receiving and condensing the working fluid vapor to discharge heat from the fluid at a second location and reform the liquid working fluid, and continuously returning the condensed working fluid from the second location to the first location.

In a further general aspect, the invention features a solar electricity generation method that includes:

concentrating solar radiation, converting part of the energy in the concentrated solar radiation into electricity and part of the energy in the concentrated solar radiation into heat, transferring at least some of the heat from the photovoltaic solar cell to a working fluid in a plurality of microchannels having a cross-sectional dimension to the center of the channel that is about equal to or less than the thermal boundary layer thickness for the working fluid, causing the working fluid to flow to another location, and extracting at least some of the heat from the working fluid after causing it to flow to another location.

DETAILED DESCRIPTION OF THE INVENTION

Figure 1:
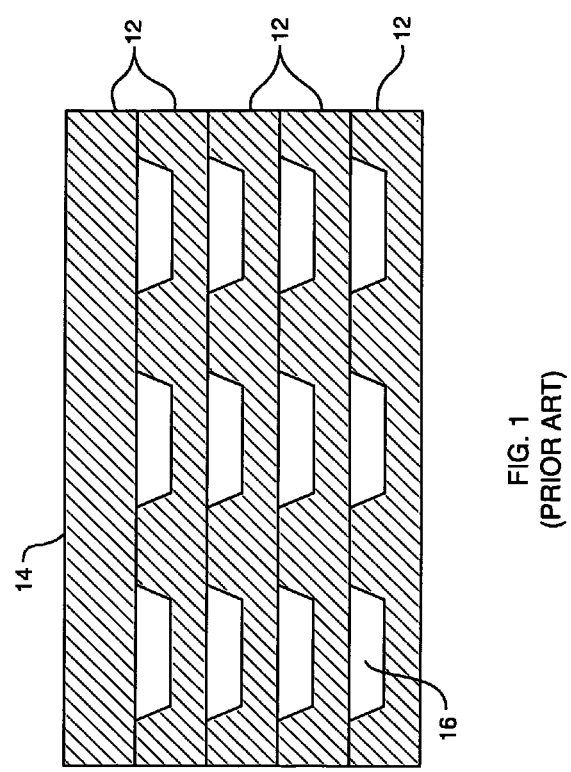
FIG. 1 shows a prior art microchannel heat exchanger core suitable for use in making a heat pipe according to the invention.

According to the invention, so-called "microchannel" heat exchange devices, sometimes also known as "printed circuit" heat exchangers, are used as the heat absorber and/or the heat sink for heat pipes. The inventor has found that heat pipes incorporating such devices afford exceptionally high heat transfer rates between the heat source or sink and working fluid. Without wishing to be bound by any particular theory or explanation, the inventor speculates that the very high efficiency of the inventive heat pipes may result from overcoming a limitation of typical conventional heat pipes, namely that the heat transfer capacity of the central tubular section of the pipe is significantly higher than is realized, due to limitations in the rates at which the heat absorber and/or heat sink transfer heat to and from the central section. In typical conventional configurations, the conductive material in contact with the working fluid and the heat source or cooling medium is relatively thick, typically on the order of 1.2-15 mm in the thinnest dimension. This may limit the rate of heat transfer, due to thermal resistance of the heat exchange material. It is also speculated that heat transfer is further impeded by the fluid film resistance at the boundary layer of the boiling or condensing working fluid adjacent to the heat exchanger material.

The fluid velocity (hydrodynamic) boundary layer thickness is a function of the Reynolds number (Re), and the thermal boundary layer thickness is a function of the hydrodyamic boundary layer thickness divided by the cube-root of the Prandtl number (Pr). The particular functions and equations depend on the system geometry (e.g. flat plates vs. tubes); although phase change can complicate matters.

$$Re = velocity * characteristic\ length * density / viscosity$$

$$Pr = heat\ capacity * viscosity / thermal\ conductivity$$

The characteristic length is the diameter for tubes, and the hydraulic diameter for non-circular channels.

The ratio of the convective to conductive heat transfer across (normal to) the boundary is given by the Nusselt number (Nu).

$$Nu = heat\ transfer\ coefficient * thermal\ conductivity / characteristic\ length$$

In laminar flow (as is the case in microchannels), the Nusselt number is a constant (at least for a given phase), so it can be seen that the heat transfer improves with the inverse of the diameter of channel thickness. This is why heat transfer improves dramatically as the channels get smaller. (The trade-off is the increasing pressure drop/flow reduction as the channels get smaller).

For internal flows (e.g. closed channels and tubes), the flow is laminar when Re<2200. So, one skilled in the art of fluid mechanics can calculate the hydrodynamic and thermal boundary layer thicknesses for known fluid properties, flow conditions, and channel geometry. The maximum microchannel diameter/thickness should be twice the lesser of the either the thermal boundary layer or hydrodynamic boundary layer thickness. (factor of two because the boundary layer can extend no farther than the mid-point of the channel).

From the fluid boundary layer equation pertinent to the geometry of interest, which is a function of Re, and the velocity, density, and viscosity (used to calculate Re), one can solve for the limiting dimension or thickness such that the fluid boundary layer thickness is equal to the distance from the wall to the centerline, when Re=2200.

From the thermal boundary layer equation pertinent to the geometry of interest, which is a function of fluid boundary layer thickness divided by the cube-root of Pr, and the heat capacity, thermal conductivity and viscosity (used to calculate Pr), one can calculate the thermal boundary layer thickness.

In contrast to conventional heat pipes, the heat absorber and/or heat sink sections of the inventive heat pipes have sub-millimeter channels and wall thicknesses whose characteristic length is smaller than the thermal boundary layer thickness, substantially reducing both the conductive resistance and the convective/thermal resistance values. While microchannel heat exchangers have been used in ordinary heat transfer services, they have not hitherto been used in conjunction with heat pipes, to transfer heat at high rates between physically separated heating and cooling sources.

The heat pipes of the present invention provide significant enhancement of heat transfer by maximizing heat exchange at the heat absorber and/or heat sink though the use of microchannel heat exchange devices, coupled with the high heat transfer rates over distances associated with the phase changes and movements of the working fluid. In some embodiments of the invention, the heat absorber and/or the heat sink are passive, by which it is meant that no pumps, fans, valves, or other energy-consuming devices are employed in their operation. An entirely passive heat pipe results if both the heat absorber and the heat sink are passive.

The heat pipes of the present invention may be used for any purpose, and are particularly advantageous for use in the dissipation of heat generated by electronic devices. Suitable arrangement of the heat pipe allows the heat generated by the electronic devices to be rejected externally to the enclosures and rooms housing the electronic devices, reducing or obviating the need to air-condition the rooms in which the electronic devices are housed.

The heat pipes of the present invention may also be particularly advantageous for use in photovoltaic electric power generating systems, such as those that employ photocells, solar collectors, and the like, to convert light to electricity. Existing photovoltaic cells generally only use a portion of the light spectrum for photovoltaic conversion; with the unusable portion of the spectrum impinging on the photovoltaic devices being converted to heat, which tends to raise the temperature of the devices and can increase the electrical resistance of the components. This reduction in conversion efficiency with increasing temperature of photovoltaic devices is well known, and it can present a particularly acute problem for solar-concentrator systems, in which the light intensity impinging on the photovoltaic device is amplified up to several orders of magnitude using a system of mirrors and/or lenses spread out across a larger light-gathering area. Solar concentrator systems are therefore often equipped with air- or water-cooled blocks backing the photovoltaic cells, to minimize the temperature rise of the photovoltaic cells. In these systems, however, the heat removal can be limited by the heat flux that attainable by the cooling blocks, which can in turn be limited by the thermal conductivity of relatively massive blocks. Furthermore, the cooling block systems often require complex and massive auxiliary equipment, such as pumps or fans and radiators, which can constrain the design flexibility and increase the costs of the solar concentrator installations. The application of heat pipes according to the invention can help to solve these problems and more efficiently, preferably passively, remove the heat from photovoltaic cells, especially those used in solar concentrator systems. This can allow for higher electrical conversion efficiency, and increase the design flexibility of solar installations.

The invention will next be illustrated with reference to the Figures, wherein similar numbers indicate similar elements in all Figures. The Figures are intended to be illustrative rather than limiting and are included to facilitate explanation of the invention. The Figures are not to scale, and are not intended to be engineering drawings. Also, it will be appreciated that the devices of the invention may be used for a wide variety of applications, and accordingly the dimensions and materials useful for making them also cover a wide range, and are sometimes interdependent. Therefore, the invention should not be construed as limited by the materials and dimensions explicitly noted in the Figures and associated text.

Heat Pipes Employing Microchannel Heat Absorbers

Prior art microchannel heat exchangers are used as the heat absorber and optionally as the heat sink for heat pipes according to the invention. The cores of the microchannel heat exchangers comprise one or more layers of parallel microchannels, wherein the largest cross-sectional dimension of the microchannels is less than 1000 microns, and preferably less than 250 microns, and the materials of construction of the heat transfer surfaces are materials with thermal conductivities in excess of 5 watts/m-° C., and preferably in excess of 17 watts/m-° C., and most preferably in excess of 170 watts/m-° C. If more than one layer of microchannels is used, the number of layers may be any number from 2 to 10, or in some cases an even larger number, e.g., as high as 20.

Referring now to FIG. 1, the working fluid microchannels 16 of a parallel flow microchannel core 14 for a heat exchanger may optionally be arranged in multiple layers 12, whereby heat transfer to outer layers is achieved by thermal conduction through the material walls connecting the layers of the microchannels. This increases the total effective heat transfer area (internal to the microchannel device) available for evaporation or condensation of the working fluid, without requiring an increase in the surface area in contact with the heat source or sink. When multiple layers are used, each layer is typically fabricated from a thin sheet with etched open channels or grooves, and the layers are bonded or fused to each other, sealing the open tops of the channels or grooves, forming closed microchannels. This arrangement results in a monolithic heat exchanger, with only one thin conducting surface interspersed between adjacent stacks of fluid channels. It also eliminates the need for a conductive spacer and its associated resistance to heat transfer. Such devices are available commercially, with one example being "Ardex" liquid coolers, manufactured by Atotech Deutschland GmbH, headquartered in Berlin, Germany. By using such a configuration for the heat absorber, the heat pipes of the present invention enjoy inherently high rates of conductive heat transfer.

Figure 2A:
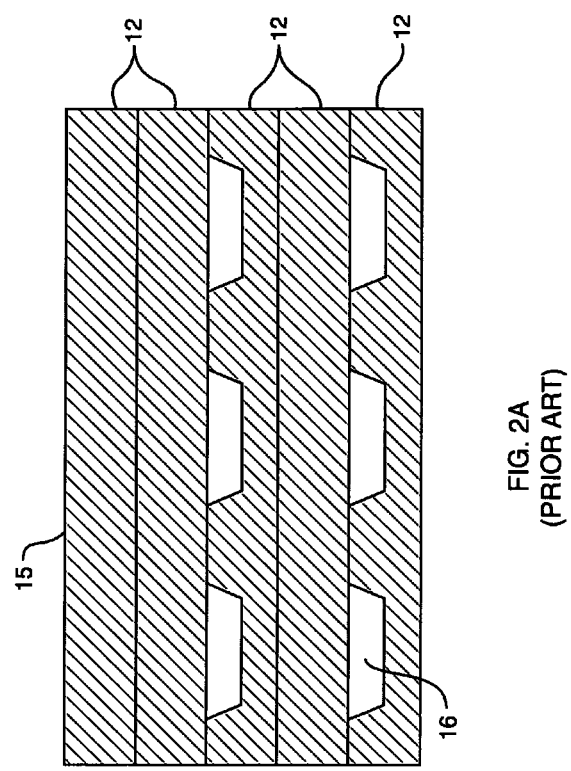
FIGS. 2a and 2b show another prior art microchannel heat exchanger core suitable for use in making a heat pipe according to the invention.
Figure 2B:
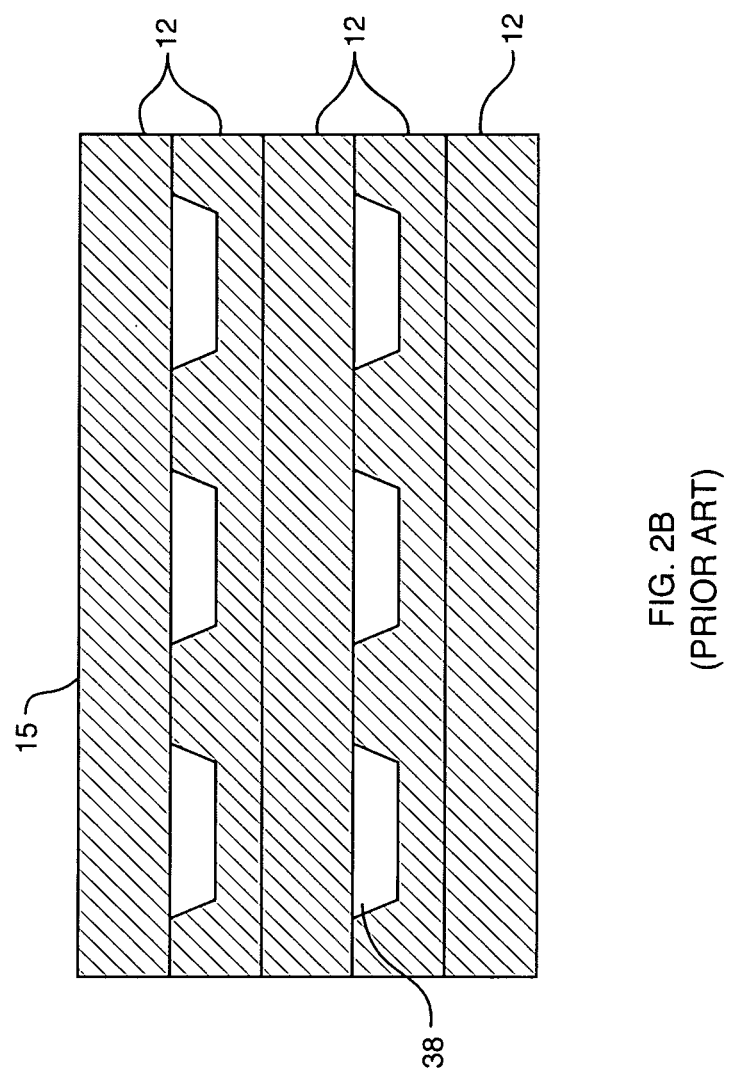

FIGS. 2a and 2b depict another prior art heat exchanger core, shown generally at 15, suitable for use in heat pipes according to the invention. Core 15, referred to herein as a cross-flow microchannel core, has two or more alternating layers 12 of microchannels, i.e., working fluid microchannels 16 as described above alternating with intermediate fluid microchannels 38. The orientation of the layers is such that alternating layers meet at common inlet and outlet regions, allowing the intermediate fluid to flow through the unit without co-mingling with the working fluid. The intermediate fluid may be any liquid or gas suitable for transferring heat away from cross-flow microchannel core 15 (in the case where the core is used in a heat sink) or to core 15 (if the core is used in a heat absorber). It is preferable to arrange the channel and layer orientation so that two fluids flow through their respective channels in directions substantially perpendicular to each other. FIG. 2a shows the heat exchanger from the side showing the working fluid microchannels 16, and FIG. 2b shows it from a side perpendicular to the first, i.e., rotated 90° about a vertical axis, showing the intermediate fluid microchannels 38. Such devices are available commercially, with one example being a Printed Circuit Heat Exchanger (PCHE), manufactured by Heatric, headquartered in Dorset, England.

Figure 3:
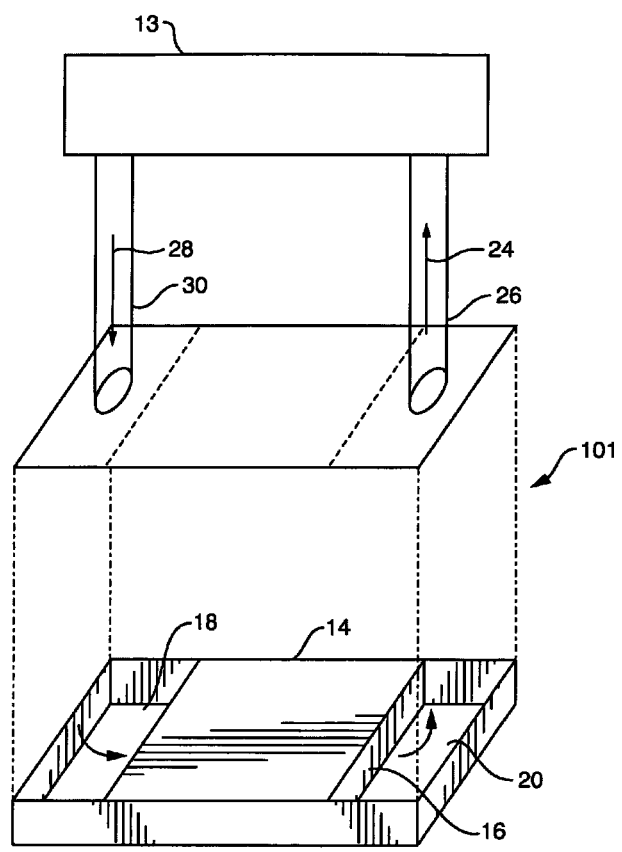
FIG. 3 shows a heat pipe according to the invention, employing a heat absorber using a parallel flow microchannel core and two pipes for connection to the heat sink.

Referring now to FIG. 3, there is shown an exploded view of a microchannel heat absorber 101 for use in a heat pipe according to the invention. This type of heat pipe is a 2-pipe configuration, also known as a thermosyphon. Heat is conducted from the heat source, i.e., the object or fluid that is to be cooled (not shown), through the surface of the bottommost layer of core 14 by conduction. The heat is further conducted into the working fluid microchannels 16 of the parallel flow microchannel core 14, constructed for example as shown in FIG. 1. Where multiple layers of microchannels are used in core 14, some of the heat is conducted to the succeeding layers by conduction through the sidewalls of layers.

The heat absorber is connected to an elevated heat sink shown schematically at 13 by means of two pipes or tubes of ordinary dimensions, typically having an inside diameter from about 50 mils to about one inch. However, there is no fundamental limit to the diameter—the larger the diameter, the higher the axial power rating, i.e. the amount of heat that can be transferred between the heat source and the heat sink. Thus, the diameter may be 2 or 3 inches or even greater. Vaporized working fluid exits parallel flow microchannel core 14 into the warm side manifold 20 and flows from the heat absorber to the heat sink by means of warm side pipe 26 (preferably of larger diameter than cool side pipe 30). At heat sink 13, the working fluid gives up its heat to a cooling medium, causing it to condense back to liquid. The condensed liquid working fluid returns from the heat sink by gravity via cool side pipe 30 to cool side manifold 18 and then into parallel flow microchannel core 14, completing the cycle.

While heat sink 13 is preferably a microchannel heat exchanger, it may alternatively be of any of any convenient design to facilitate condensation of the working fluid, e.g., a conventional heat exchanger, air-cooled finned tubes or hollow plates, thermoelectric cooler, etc.

Figure 4:
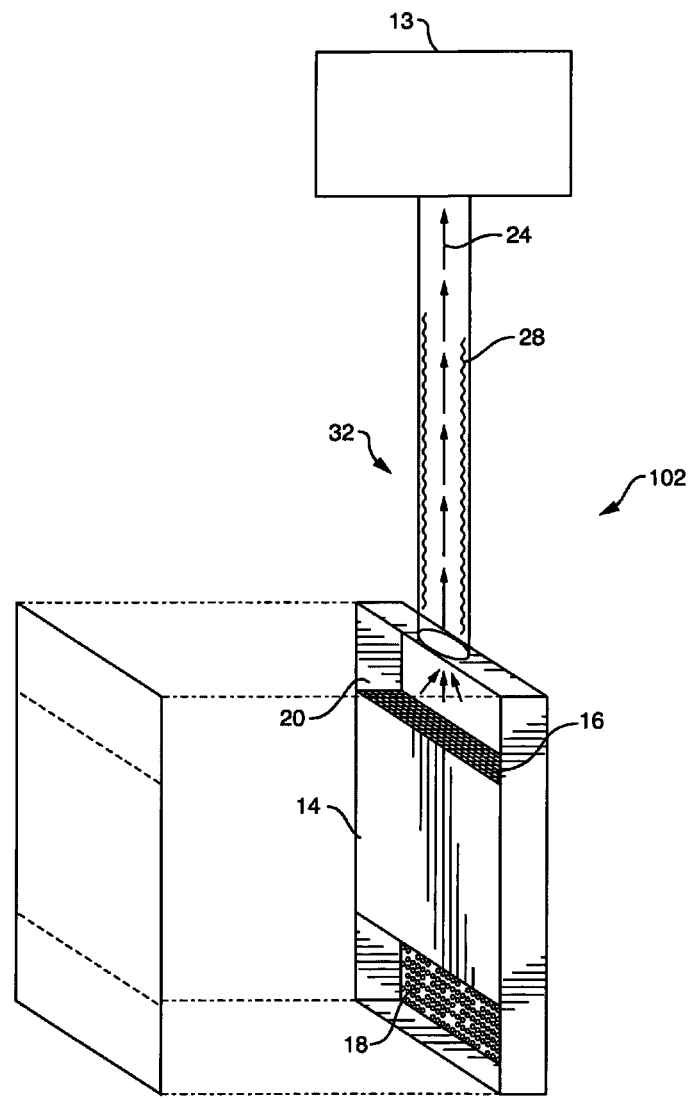
FIG. 4 shows a heat pipe according to the invention, employing a heat absorber using a parallel flow microchannel core and a single pipe for connection to the heat sink.

FIG. 4 shows an embodiment of the invention in which the heat absorber 102 is similar to that described in FIG. 3, but is connected to heat sink 13 by means of common connecting pipe 32, through which vaporized working fluid 24 and liquid working fluid 28 move co-axially and counter-currently. The heat pipe functions in a manner similar to that of FIG. 3, except that vaporized working fluid 24 moves through the central portion of common connecting pipe 32, and liquid working fluid 28 travels along the walls of the pipe, e.g., as a moving annular film. In another embodiment (not shown), common connecting pipe 32 has an annular or co-axial wick for co-axial counter-flow of the liquid and vaporized working fluid. For example, the walls of the connecting pipe may be lined with an annular band of, or packed co-axially with, a porous wicking material. The liquid travels by capillary action through the porous wicking material. This allows the heat pipe to be oriented other than substantially vertically, e.g., with the heat sink level with or even below the heat absorber.

Figure 5:
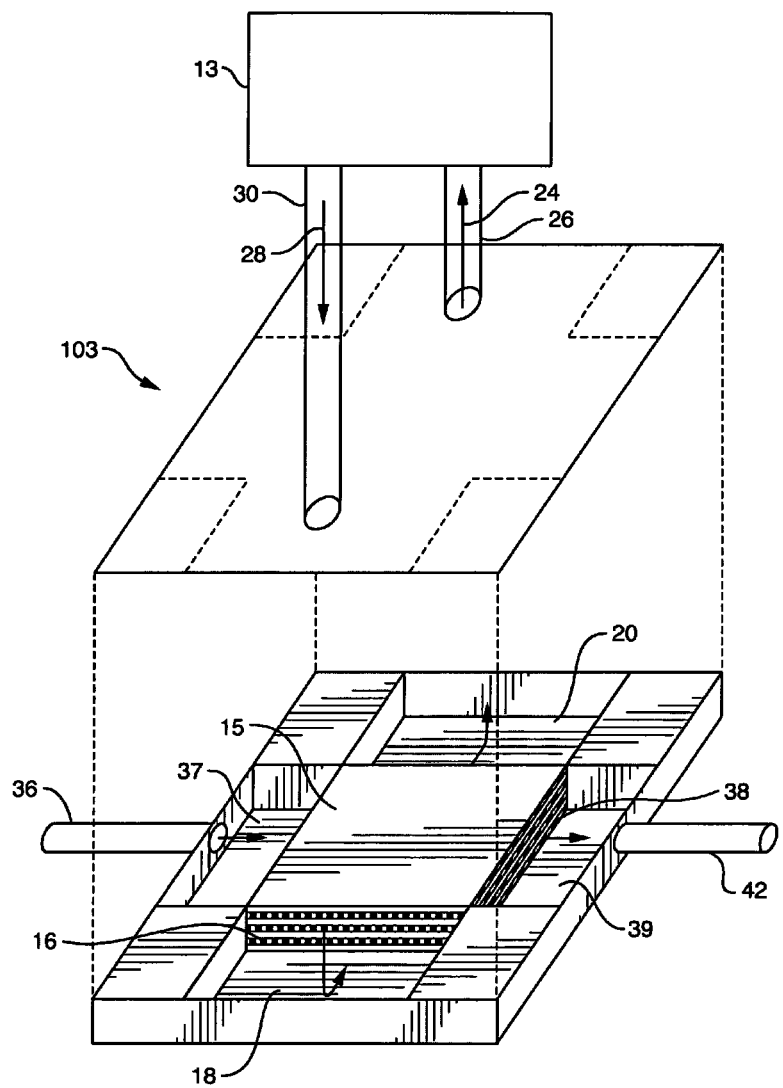
FIG. 5 shows a heat pipe according to the invention, employing a heat absorber using a cross-flow microchannel core and two pipes for connection to the heat sink.

FIG. 5 shows another embodiment of the invention, employing a heat absorber 103 that includes a cross-flow microchannel core 15 such as shown in FIG. 2. Heat is transferred from the heat source to heat absorber 104 by means of an intermediate fluid, e.g., liquid, gas, or condensable vapor. The relatively hot/warm intermediate fluid enters through inlet pipe 36 into inlet manifold 37, flows through intermediate fluid microchannels 38, exits cross-flow microchannel core 15 into outlet manifold 39 at a lower temperature, and exits the heat absorber via outlet pipe 42. While in cross-flow microchannel core 15, the intermediate fluid is cooled by the working fluid through heat conduction into the (boiling) working fluid in the intervening layers, via the walls of the working fluid microchannels 16 and the intermediate fluid microchannels 38.

Figure 6:
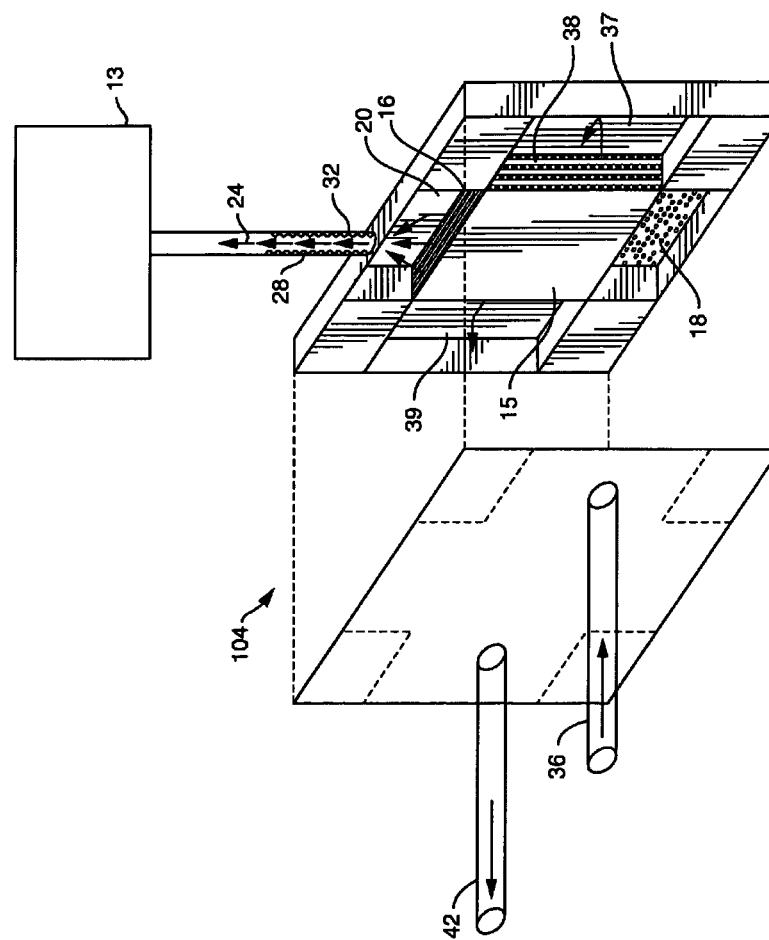
FIG. 6 shows a heat pipe according to the invention, employing a heat absorber using a cross-flow microchannel core and a single pipe for connection to the heat sink.

FIG. 6 shows another embodiment of the invention, in which the heat absorber 104 is connected to a heat sink shown schematically at 13 by means of common connecting pipe 32, through which vaporized working fluid 24 and liquid working fluid 28 move co-axially and counter-currently. The vapor moves through the central portion of the connecting pipe, and the liquid travels along the walls of the pipe, e.g., as a moving annular film. Heat is transferred from the heat source to heat absorber 103 by means of an intermediate fluid, e.g., liquid, gas, or condensable vapor. The intermediate fluid enters through inlet pipe 36 into inlet manifold 37, flows through intermediate fluid microchannels 38, exits cross-flow microchannel core 15 into outlet manifold 39, and exits 103 via outlet pipe 42. While in cross-flow microchannel core 15, the intermediate fluid is cooled by the (boiling) working fluid through heat conduction into the working fluid in the intervening layers, via the walls of the working fluid microchannels 16 and the intermediate fluid microchannels 38. In another embodiment (not shown), common connecting pipe 32 has an annular or co-axial wick for co-axial counter-flow of the liquid and vaporized working fluid. For example, the walls of the connecting pipe may be lined with an annular band of, or packed co-axially with, a porous wicking material. The liquid travels by capillary action through the porous wicking material. This allows the heat pipe to be oriented other than substantially vertically, e.g., with the heat sink level with or even below the heat absorber.

Heat Pipes Employing Microchannel Heat Sinks

Figure 7:
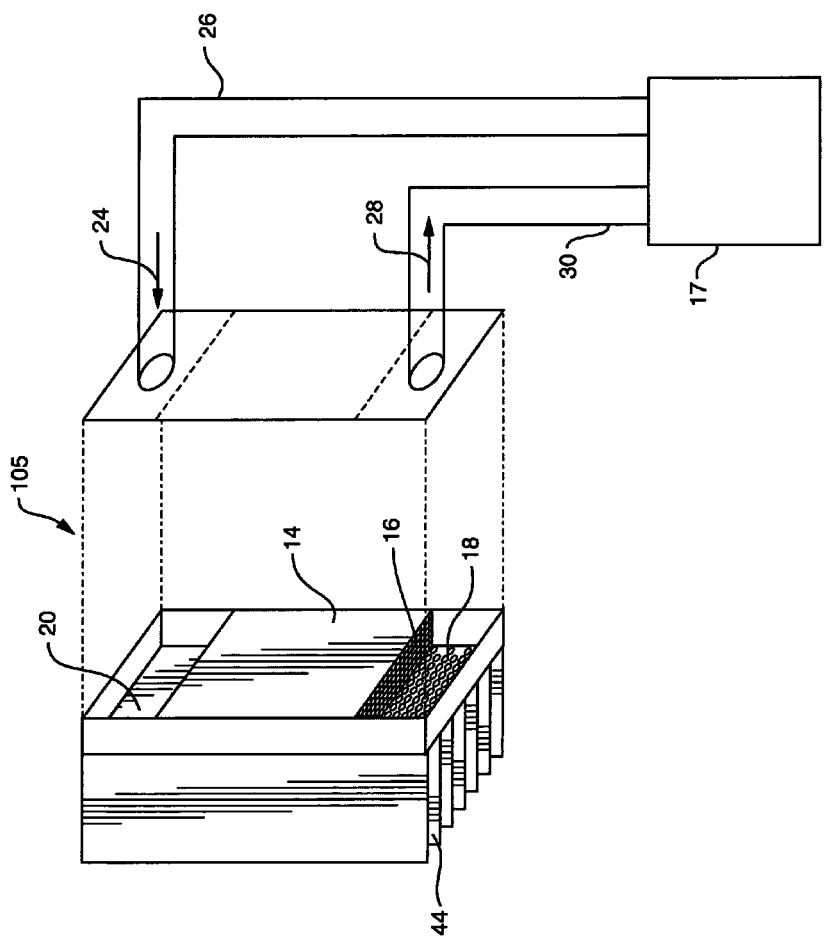
FIG. 7 shows a heat pipe according to the invention, employing a heat sink using a parallel flow microchannel core and two pipes for connection to the heat absorber.

Referring now to FIG. 7, there is shown an embodiment of the invention in which the heat sink 105 is a microchannel heat exchanger with extended surfaces cooled by natural or forced convection with air or other fluid coolants, and the heat pipe has separate connecting pipes for the liquid and vaporized working fluid. The structure is similar to that of the heat absorber shown in FIG. 3, with the addition of cooling surfaces 44, and the spatial orientation is typically as shown in FIG. 7, i.e., rotated about a horizontal axis extending into the page 90° relative to the way it would be oriented when used as a heat absorber such as in FIG. 3.

The cooling surfaces 44 are provided on the outside of one or both sides of a single-layer unit, or the outsides of one or both of the outermost layers in a multi-layer unit. They may comprise thin extensions of thermally conductive material, to provide additional heat transfer surface area exposed to the air or other final cooling medium. The extended surfaces may be of any convenient geometry or orientation; e.g., pins, parallel perpendicular fins, spaced fibers, ribs, and the like.

Heat sink 105 is connected to a microchannel heat absorber shown schematically at 17 located at a lower elevation by means of two pipes or tubes of ordinary dimensions, typically having an inside diameter from about 50 mils to about one inch. However, there is no fundamental limit to the diameter—the larger the diameter, the higher the axial power rating. Vaporized working fluid flows from the heat absorber to the heat sink by means of warm side pipe 26 and enters parallel flow microchannel core 14 at warm side manifold 20. Heat is conducted out of the heat sink via cooling surfaces 44 into a surrounding fluid, which may be a gas such as air or a liquid, resulting in condensation of the working fluid in working fluid microchannels 16. The condensed liquid working fluid exits parallel flow microchannel core 14 at cool side manifold 18 returns via cool side pipe 30 to by gravity to the heat absorber. Warm side pipe 26 is preferably connected at a high point above parallel flow microchannel core 14.

Figure 8:
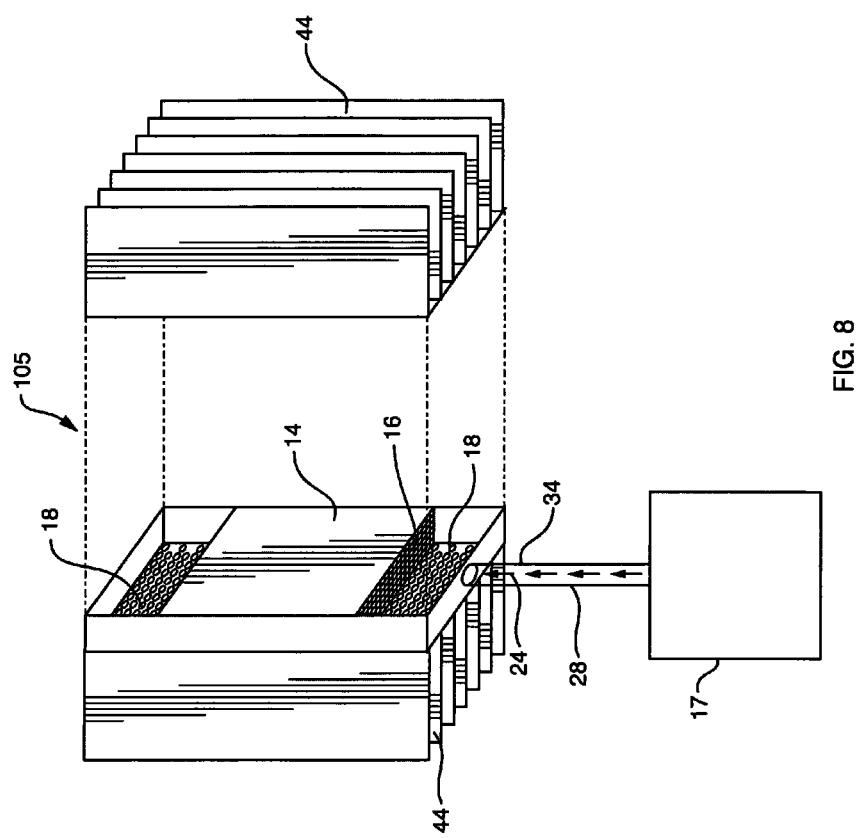
FIG. 8 shows a heat pipe according to the invention, employing a heat sink using a parallel flow microchannel core and a single pipe for connection to the heat absorber.

FIG. 8 shows an embodiment of the invention in which the heat sink, shown generally at 106, is a microchannel heat exchanger similar to the heat absorber shown in FIG. 4, with the addition of cooling surfaces 44 as described above. As shown in FIG. 8, its typical orientation will be inverted relative to the orientation when used as a heat absorber.

Vaporized working fluid 24 flows from the heat absorber shown schematically at 17 to the heat sink by means of common connecting pipe 32 and enters parallel flow microchannel core 14 at warm side manifold 20. Heat is conducted out of the heat sink via cooling surfaces 44 into a surrounding fluid, which may be a gas such as air or a liquid, resulting in condensation of the working fluid in working fluid microchannels 16. Condensed liquid working fluid 28 travels along the walls of common connecting pipe 32, e.g., as a moving annular film. In another embodiment (not shown), common connecting pipe 32 has an annular or co-axial wick for co-axial counter-flow of the liquid and vaporized working fluid. For example, the walls of the connecting pipe may be lined with an annular band of, or packed co-axially with, a porous wicking material. The liquid travels by capillary action through the porous wicking material. This allows the heat pipe to be oriented other than substantially vertically, e.g., with the heat sink level with or even below the heat absorber.

In another embodiment of the invention, the heat sink is constructed in substantially the same manner as the heat absorber shown in FIG. 5, but with an inverted orientation. Heat is transferred out of the heat sink by means of the intermediate fluid (liquid or gas), which is at a relatively low temperature when it enters cross-flow microchannel core 15 via inlet pipe 36 and inlet manifold 37, and which exits cross-flow microchannel core 15 at a higher temperature via outlet manifold 39 and outlet pipe 42. Condensation of vaporized working fluid occurs in a manner substantially the same as described above with respect to FIG. 7, except that heat exits the heat sink via the intermediate fluid.

In another embodiment of the invention, the heat sink is constructed in substantially the same manner as the heat absorber shown in FIG. 6, but with an inverted orientation. Entry and condensation of vaporized working fluid 24, and return of liquid working fluid 28, occur substantially the same way as described with respect to FIG. 8, and heat is transferred out of the heat sink in substantially the same way as in the device of FIG. 1. In another embodiment common connecting pipe 32 has an annular or co-axial wick for co-axial counter-flow of the liquid and vaporized working fluid, as described previously.

In another embodiment of the invention, the heat sink is constructed in substantially the same manner as the heat absorber shown in FIG. 3, but with an inverted orientation. Heat is removed from the heat sink by thermal conduction through the outer surfaces into a cooling medium. The cooling medium may be a fluid (e.g., the heat sink is immersed), or a cool solid which is kept cool by external means, e.g., by refrigeration, thermo-electric cooling, evaporations of an external fluid, sensible heating of a flowing external fluid, etc. Condensation of vaporized working fluid occurs in a manner substantially the same as described above with respect to FIG. 7.

In another embodiment of the invention, the heat sink is constructed in substantially the same manner as the heat absorber shown in FIG. 4, but with an inverted orientation. Entry and condensation of vaporized working fluid 24, and return of liquid working fluid 28, occur substantially the same way as described with respect to FIG. 8, and heat is removed from the heat sink by thermal conduction through the outer surfaces into a cooling medium as described in the immediately preceding embodiment. In another embodiment, common connecting pipe 32 has an annular or co-axial wick for co-axial counter-flow of the liquid and vaporized working fluid, as described previously.

According to the invention, any microchannel heat absorber may be combined with any heat sink. Microchannel heat sinks will be used in many situations. For example, the heat sink of FIG. 8 may be combined with the heat absorber of FIG. 4. Or, the heat sink of FIG. 7 may be combined with the heat absorber of FIG. 3. Other combinations will be apparent to those of skill in the art, and all of these are contemplated by the invention.

Working Fluids

Many fluids may be used as the working fluid in heat pipes according to the invention. The fluid must have sufficient vapor pressure under the temperature and pressure conditions of use to allow significant vaporization and condensation, as described earlier herein. Since temperature and pressure conditions vary substantially from one application to the next, a wide variety of fluids may be used. Common examples include water, alcohols and hydrocarbons. The inventor has found that heat pipes according to the invention are particularly useful when the working fluid is a fluorocarbon (FC) or hydrofluorocarbon (HFC) or a chlorofluoroalkene (CFA) or a chlorinated hydrofluoroalkene (CHFA), or a mixture of these. In the event of a loss of containment, these materials are unlikely to ignite, have minimal adverse environmental or health consequences, cause no damage to electronic components, create no risk of electric shock, and are readily dissipated. They are low in toxicity, electrically non-conductive, non-corrosive to most materials, and have little or no flammability.

Suitable FC, HFC, CFA or CHFA working fluids will typically be chosen to match their thermodynamic properties to the particular working temperatures and pressures of the heat pipe systems in which they are used. Exemplary fluids include any of the various commercially available pentafluoropropanes, hexafluoropropanes, pentafluorobutanes, and monochloro fluoropropenes. For heat pipes operating in the range of ambient (about 20° C.) to about 100° C., exemplary suitable working fluids include those having normal boiling points (i.e., boiling points at atmospheric pressure) in the range of 10° C. to 80° C., and more typically in a range from 10° C. to 45° C. Suitable classes of HFC's include pentafluoropropanes, hexafluoropropanes, and pentafluorobutanes. Specific examples of suitable HFC's include HFC-245fa, HFC-245ca, HFC-236ca, HFC-365mfc, and mixtures thereof. Specific examples of suitable CHFA's include HCFC 1233zd, and HCFC 1233cf. Heat pipe systems including these working fluids typically operate at pressures mildly elevated with respect to atmospheric pressure. In some embodiments, heat pipes according to the invention may have heat sinks operating at a condensation temperature of about 30° C. to about 50° C., and HFC-245fa, HFC-245ca, HFC-236ca, HFC-365mfc, HCFC 1233zd, and HCFC 1233cf may be particularly well suited for use in such systems.

In one embodiment, the invention provides a method of cooling an article, liquid, or gas with heat pipe system using as its working fluid HFC-245fa, HFC-245ca, HFC-236ca, HFC-365mfc, HCFC 1233zd, HCFC 1233cf, or a mixture of these. In this embodiment the structure of the heat pipe may be any described herein, but the inventor contemplates the use of these fluids in a heat pipe of any structure as well. Thus heat pipe systems of any structure containing these fluids, and methods of cooling by the use of such systems, are also claimed.

In some embodiments of the invention, heat pipes such as disclosed herein may be installed in electronic equipment to expel heat from a microelectronic device to a location external to the electronic device enclosure.

For microelectronic devices/enclosures that are housed in air-conditioned rooms, e.g., computer data centers, industrial control rooms, and the like, it is preferred in some embodiments to place the heat sink of the heat pipe in an air duct or water pipe, so that a flow of ambient (externally supplied) air or cooling water, rather than air-conditioned air, is used to carry away the rejected heat to a location external to the room or building housing the microelectronic devices. Such an arrangement allows the cooling and heat removal to be accomplished with little or no air conditioning dedicated to the electronic devices, thereby reducing energy consumption.

The interconnecting pipe(s) need not be integral with the heat absorber or heat sink sections. The connecting pipes may be assembled separately from and joined to the heat absorber and heat sink sections. As a consequence, the interconnecting pipes can be of any convenient length, provided that the pressure drop is less than the driving force (gravity and/or capillary pressure) for returning the condensed liquid to the heat absorber. The use of relatively long interconnecting pipes allows the heat sink and its associated cooling medium to be located remotely from the heat source. In the case of an enclosed heat source, e.g., microelectronic device, combustion chamber, radioactive area, etc., this allows the heat to be removed without transferring heat back to other objects in the immediate vicinity of the heat source. It also allows the use of cooling media other than air at the heat sink, e.g., water, refrigerated fluids, thermoelectric cooling devices, etc. In some embodiments, the length of the pipes may be in a range from 5 to 10 inches, for example when used to reject heat from inside an electronic device (e.g., a personal computer) to the surrounding air. In other embodiments, the length may be from 5 to 10 feet or even from 5 to 30 feet, such as when heat is to be rejected to an air vent or outside of the room containing the heat source. However, the length may be even greater if the connecting diameter is sufficiently large to keep the pressure drop low enough for good flow.

Warm side pipe 26, cool side pipe 30, and common connecting pipe 32 will typically have smaller cross-sections than the heat absorber or heat sink sections, to facilitate the collection and flow of the liquid and vaporized working fluid. The pipes may be of any arbitrary shape and, if suitably thin-walled, may be readily flexed or bent to accommodate off-set placement of the heat sink relative to the heat absorber, and/or routing of the connecting pipes around other objects.

EXAMPLES

Example 1

Air-Cooled Single-Tube Non-Wick Heat Pipe System

A heat pipe system is constructed, consisting of a microchannel block-type heat absorber, a finned microchannel heat sink, a connecting pipe, and a working fluid. The heat absorber is an Atotech "Ardex MC-1" microchannel CPU cooler, manufactured by Atotech Deutschland GmbH of Berlin, Germany. One of the two threaded ports is provided with a male adapter ⅜" tube fitting. The other threaded port is closed off with a pipe plug. The heat sink is an Atotech "Ardex MC-1" microchannel CPU cooler, modified by the addition of thin sheet metal copper cooling fins soldered to the flat side of the MC-1 device. One of the two threaded ports is provided with a male adapter ⅜" tube fitting. The other threaded port is closed off with a pipe plug. The connecting pipe is a ⅜" diameter semi-flexible copper or perfluoroalkoxy (PFA) plastic tube, connected to the absorber and heat sink by means of the tube fittings. The connecting pipe is preferably insulated, to minimize heat transfer between the connecting tube and the air space surrounding it. This is useful if the heat pipe connecting tube is within an enclosure (and the heat sink outside the enclosure), to minimize the temperature rise in the enclosure and ensure maximum rejection of heat from the heat source while minimizing heat-up of the enclosure. The connecting pipe is optionally bent, to allow the heat sink to be offset from the heat absorber.

The heat pipe assembly and a container of working fluid (HFC-245fa) is chilled in a domestic refrigerator, to approximately 4.4° C. (40° F.). The chilled liquid working fluid is charged to the heat pipe assembly by removing the pipe plug from the heat absorber, and poured in until the liquid level is approximately at same level as the top of the microchannel plate stack. After charging with the working fluid, the pipe plug is replaced, sealing the system.

The heat pipe assembly is oriented vertically, with the heat absorber block at the bottom, and the finned heat sink section at the top. The heat absorber block is placed in direct contact with the hot object to be cooled, e.g., a central processing unit (CPU) of a computer, which generates heat during operation. The finned heat sink section is exposed to ambient temperature air, which may optionally be circulated around the fins by means of an external fan, to improve the rate of heat removal.

Conduction of heat from the hot object via the heat transfer block causes the working fluid to boil. The vapors travel via the central portion of the connecting pipe, and are cooled and condensed by conduction with the finned heat sink section, and the heat is rejected by convection to the ambient air. The condensed fluid returns by gravity along the walls of the connecting pipe to the heat transfer block, allowing the cycle to repeat. During operation, the temperature of the working fluid rises to a value intermediate between that of the heat source and that of the ambient air external to the heat sink.

At steady state conditions (e.g., assuming heat generation at a constant rate or wattage) the temperature of the working fluid is determined by the heat absorption being in balance with the heat rejection, according to the following relationships:

$$Q_{absorbed} = U_{absorber} \times A_{absorber} \times (T_{hot} - T_{fluid})$$

$$Q_{rejected} = U_{sink} \times A_{sink} \times (T_{fluid} - T_{air})$$

$$T_{fluid} = \frac{(U_{absorber} \times A_{absorber} \times T_{hot}) + (U_{sink} \times A_{sink} \times T_{air})}{U_{absorber} \times A_{absorber} \times U_{sink} \times A_{sink}}$$

Where
Q=heat transfer rate
U=heat transfer coefficient
A=heat transfer area
$T_{hot}$=temperature of heat source Example 2

Air-Cooled Two-Tube Non-Wick Heat Pipe System

A heat pipe system was constructed, consisting of an Atotech Ardex P microchannel block-type heat absorber, a finned microchannel heat sink, two connecting pipes, and a working fluid. The microchannel heat sink consisted of an Atotech Ardex P microchannel block soldered to a CompUSA Pentium 4 Socket 478 CPU cooler fin-fan assembly. The heat pipe assembly consisted of substantially the same equipment and construction as used in Example 1, with the following differences. The second port of the heat absorber was provided with a ¼" tube fitting male run tee, in lieu of the pipe plug. The second port of the heat sink was provided with a male adapter ¼" tube fitting, in lieu of the pipe plug. Two connecting pipes were used. The vapor pipe was a ⅜" diameter PFA tube, and the liquid pipe was a ¼" PFA tube. The connecting tubes were connected to the absorber by means of the tube fittings on the heat absorber and the heat sink. The working fluid was charged by means of the unused port on the tee connected to heat absorber. After charging, the port was capped with a tube-fitting plug.

The heat pipe assembly was oriented vertically, with the heat absorber block at the bottom, and the finned heat sink section at the top. The heat absorber block was placed in direct contact with the hot object to be cooled. A 2¼ inch square×½ inch thick aluminum block, provided with an electrical cartridge heater embedded in the middle of the block and connected to a Variac™ power source, was used to simulate the central processing unit (CPU) of a computer, which generates heat during operation. The heated block was provided with a thermocouple embedded in the block, adjacent to the cartridge heater. The finned heat sink section was exposed to ambient-temperature air. (Note, although not done in this example, air may optionally be circulated around the fins by means of an external fan, to improve the rate of heat removal.)

Conduction of heat from the hot object via the heat transfer block caused the working fluid to boil. The vapors traveled via the larger diameter vapor pipe, and are cooled and condensed by conduction with the finned heat sink section, and the heat was rejected by convection to the ambient air. The condensed fluid returned by gravity to the heat transfer block via the smaller diameter liquid return pipe, allowing the cycle to repeat. The fluid flow was visible in the semi-transparent PFA tubing. The temperature and pressure of the working fluid reached steady state, substantially as described in Example 1. A plot of the block temperature as a function of cartridge heater power (wattage) is shown in FIG. 9, in comparison with the temperatures obtained using an un-cooled block, a block cooled by a conventional "pin-fin" CPU cooler, and an empty Ardex P cooling block.

Figure 9:
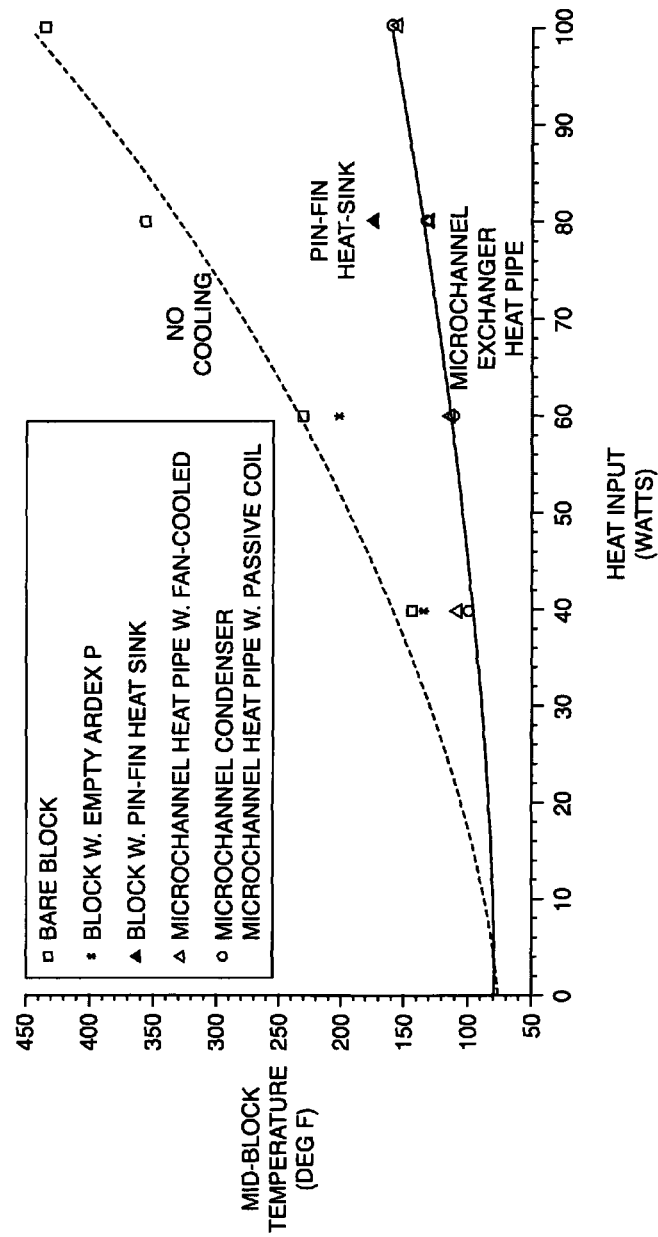
FIG. 9 is a graph showing the heat removal performance of two heat pipes according to the invention compared with prior art cooling devices.
Figure 10:
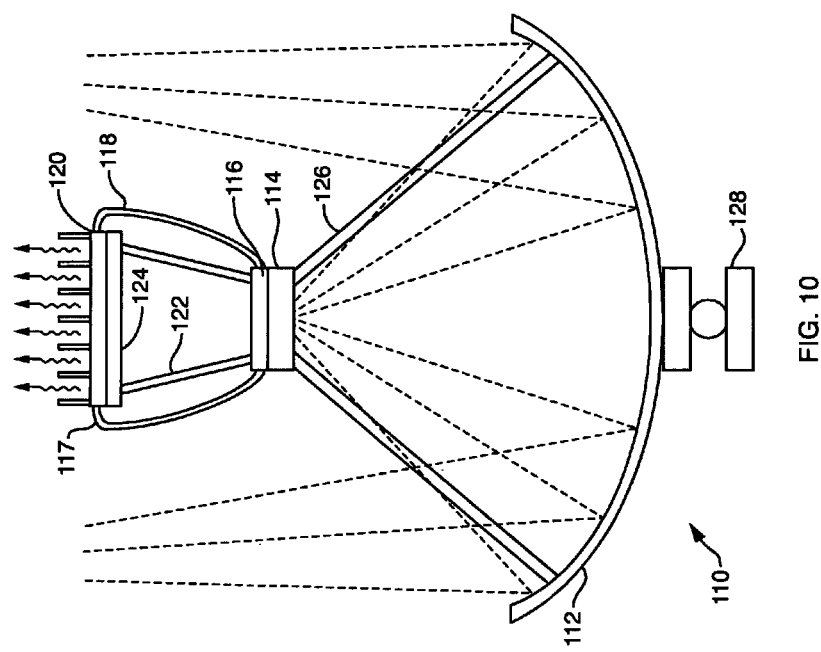
FIG. 10 is a cross-sectional diagram of an illustrative embodiment of a solar electricity generation system employing microchannel heat exchangers.
Figure 11:
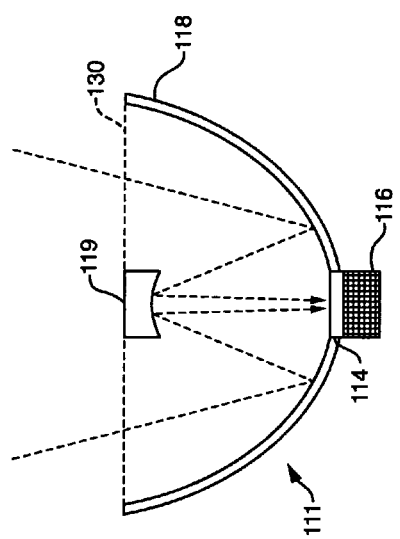
FIG. 11 is a cross-sectional diagram of another illustrative embodiment of a solar electricity generation system.
Figure 12:
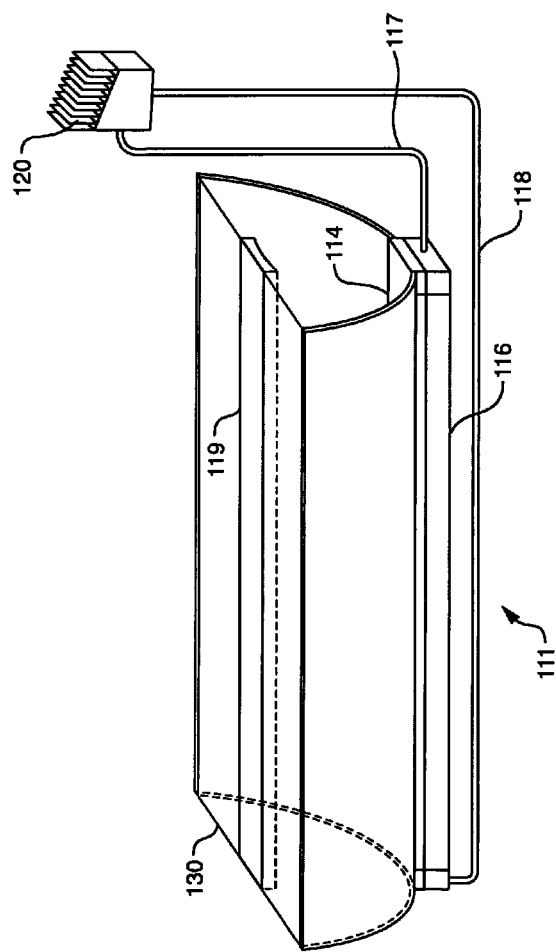
FIG. 12 is a perspective diagram of the solar electricity generation system of FIG. 11.

As can be seen from the data in FIG. 9, the bare block without cooling became extremely hot at the higher power input levels, and a prior art pin-fin CPU cooler provided some degree of cooling. However, the two heat pipes using microchannel heat absorbers according to the invention provided substantially more cooling than the pin-fin cooler. In fact, the microchannel systems provided better cooling (lower block temperature) at 100 watts power input than the pin-fin cooler did at only 80 watts. For comparison, a run is also shown using a microchannel heat pipe without any working fluid (labeled "Block w. Empty Ardex P"), and this provided minimal cooling as expected.

Example 3

Liquid-Cooled Single-Tube Heat Pipe System

A heat pipe system is constructed, consisting of a microchannel block-type heat absorber, a water-cooled microchannel heat exchanger heat sink, a connecting pipe, and a working fluid. The heat pipe assembly consists of substantially the same equipment as described in Example 2, with the following differences. The heat sink is a cross-flow 2-fluid microchannel heat exchanger. The working fluid is the first fluid, and flowing cooling water is the second fluid, so that heat is removed from the system by heat transfer from the condensing working fluid vapors, through the walls of the microchannel heat sink, into the cooling water.

Example 4

Air-Cooled Single-Tube Heat Pipe System with Wick

A heat pipe system similar to that of Example 1 is constructed, except that an annular band of porous wicking material is inserted along the inside wall of the connecting pipe. In this example, the wicking material is an annular roll of sintered—35+65 mesh spherical fine-mesh stainless steel powder. The wicking material causes the condensed working fluid to return to the heat absorber block by capillary action. This allows the heat pipe to be oriented horizontally or even with the heat sink section below the heat absorber block, provided that the capillary force is greater than the gravitational force acting on the returning fluid.

Example 5

Air-Cooled Dual-Tube Heat Pipe with Liquid Return Line Wick

A heat pipe system similar to that of Example 2 is constructed, except that the liquid return pipe is packed with porous wicking material. In this example, the wicking material is a braid of fiberglass. The wicking material causes the condensed working fluid to return to the heat absorber block by capillary action. This allows the heat pipe to be oriented horizontally or even with the heat sink section below the heat absorber block, provided that the capillary force is greater than the gravitational force acting on the returning fluid.

Example 6

Cooling of a Microelectronic Device by Means of a Heat Pipe, Rejecting the Heat Externally to the Microelectronic Device Enclosure and Room A heat pipe system similar to that of Example 4 is constructed with the heat absorber in contact with the surface of a computer microprocessor (i.e. central processing unit or CPU) to provide a means of cooling to remove the heat generated by the CPU, to prevent overheating. The wick-bearing connecting tube is routed externally to the housing of the computer, and the finned heat sink is placed in an air duct, wherein the air duct is supplied with non-air-conditioned fresh air from outside the room or building housing the computer. Using this configuration, the air warmed by the rejected heat is routed outside the room or building housing the computer.

This arrangement may be repeated for multiple microelectronic devices, e.g., other heat generating processors (such as graphic processing units or GPUs), controller "chips", power supplies, and the like that are housed in a common enclosure, and/or multiple separately enclosed microelectronic devices, with some or all of the heat pipes rejecting their heat to a common externally-supplied and vented system of air ducts.

This arrangement is in contrast to conventional practices, wherein heat removed from the computer components devices is rejected within the enclosure (e.g., by fin/fan combinations mounted on the CPU, GPU, and controller chips), and fans are used to blow air through the enclosure, moving the heat out into the room housing the computer, heating up the air in the room. This arrangement often requires that the room housing the computer(s) be air conditioned, to prevent the air temperature from rising beyond acceptable limits. It has been calculated that the power requirements associated with the air-conditioning of the rooms housing the computers, e.g., for data centers, is comparable to the power consumed by the computers. Thus, by transferring the heat to externally-supplied and vented non-air-conditioned air, the overall power requirements for the computer system and its ancillary systems may be reduced by nearly half. In another embodiment, the external cooling may be provided by an inexpensive liquid coolant, e.g., cooling water, in lieu of air. In either case, the air or the liquid coolant may flow to a location out outside of the room, thereby reducing the amount of heat added to the room environment.

Although the invention is illustrated and described herein with reference to specific embodiments, it is not intended that the subjoined claims be limited to the details shown. Rather, it is expected that various modifications may be made in these details by those skilled in the art, which modifications may still be within the spirit and scope of the claimed subject matter and it is intended that these claims be construed accordingly.

What is claimed is:

1. A heat pipe comprising:
   a) a microchannel heat absorber comprising at least one layer defining a plurality of microchannels each having a cross-sectional dimension to a center of that microchannel that is about equal to or less than a thermal boundary layer thickness for a working fluid and terminating at a first end thereof in a cool side manifold and at a second end thereof in a warm side manifold, the microchannels adapted to contain the liquid working fluid that absorbs heat and forms a vapor upon flowing therethrough from the first end to the second end,
   b) a heat sink for receiving and condensing the vapor to reform the liquid working fluid and for discharging the liquid working fluid, and
   c) one or more pipes flowably connecting the warm side manifold of the heat absorber to the heat sink and flowably connecting the cool side manifold of the heat absorber to the heat sink, wherein the one or more pipes are connected so as to permit simultaneous flow of the vapor from the heat absorber to the heat sink and of the liquid working fluid from the heat sink to the heat absorber when heat is applied to the heat absorber.

2. The heat pipe of claim 1, wherein the at least one layer comprise a material having a thermal conductivity greater than 5 watts/m ° C.

3. The heat pipe of claim 1, wherein the microchannel heat absorber is a parallel flow microchannel heat absorber.

4. The heat pipe of claim 1, wherein the microchannel heat absorber is a cross-flow microchannel heat absorber.

5. The heat pipe of claim 1, wherein the at least one layer comprises a material having a thermal conductivity greater than 170 watts/m ° C. and the microchannels have a largest cross-sectional dimension of less than 250 microns.

6. The heat pipe of claim 1, wherein the number of layers is from 2 to 10.

7. The heat pipe of claim 1, wherein the one or more pipes comprises a first pipe flowably connecting the warm side manifold of the heat absorber to the heat sink and a second pipe flowably connecting the cool side manifold of the heat absorber to the heat sink.

8. The heat pipe of claim 1, wherein the one or more pipes comprises only a single pipe.

9. The heat pipe of claim 8, wherein the single pipe comprises a porous coaxial wick.

10. The heat pipe of claim 8, wherein the single pipe comprises an annular band of a porous wicking material.

11. The heat pipe of claim 1, wherein the heat sink is a microchannel heat sink.

12. The heat pipe of claim 1, wherein the microchannels are substantially rectangular channels, wherein the cross-sectional dimension of the microchannels is a shorter of two different cross-sectional dimensions for the microchannels, and wherein the shorter cross-sectional dimensions are aligned perpendicular to a surface of a heat source.

13. A heat pipe system comprising:
a working fluid, and
a heat pipe containing the working fluid and including:
a) a microchannel heat absorber comprising at least one layer defining a plurality of microchannels each having a cross-sectional dimension to a center of that microchannel that is about equal to or less than a thermal boundary layer thickness for the working fluid and terminating at a first end thereof in a cool side manifold and at a second end thereof in a warm side manifold, the microchannels adapted to contain the working fluid as a liquid that absorbs heat and forms a vapor upon flowing therethrough from the first end to the second end,
b) a heat sink for receiving and condensing the vapor to reform the liquid working fluid and for discharging the liquid working fluid, and
c) one or more pipes flowably connecting the warm side manifold of the heat absorber to the heat sink and flowably connecting the cool side manifold of the heat absorber to the heat sink, wherein the one or more pipes are connected so as to permit simultaneous flow of the vapor from the heat absorber to the heat sink and of the liquid working fluid from the heat sink to the heat absorber when heat is applied to the heat absorber.

14. The heat pipe system of claim 13, wherein the working fluid is a fluorocarbon, a hydrofluorocarbon, a chlorinated fluoroalkene, a chlorinated hydrofluoroalkene, or a mixture thereof.

15. The heat pipe system of claim 13, wherein the working fluid is selected from the group consisting of HFC-245fa, HFC-245ca, HFC-236ca, HFC-365mfc, HCFC 1233zd, HCFC 1233xf, and mixtures thereof.

16. The heat pipe of claim 13, wherein the heat absorber is located within an electronic device enclosure and the heat sink is located outside the enclosure.

17. The heat pipe of claim 16, wherein the heat sink is installed outside of a room housing the electronic device enclosure or in a cooling duct that flows to a location out outside of the room, wherein the cooling medium flowing through the duct is air or water.

18. A heat pipe system comprising:
a working fluid, and
a microchannel heat pipe containing the working fluid and including:
b) a microchannel heat absorber adapted to contain the working fluid as a liquid that absorbs heat and forms a vapor and adapted to define a plurality of microchannels each having a cross-sectional dimension to a center of that microchannel that is about equal to or less than a thermal boundary layer thickness for the working fluid,
c) a heat sink for receiving and condensing the vapor to reform the liquid working fluid and for discharging the liquid working fluid, and
d) one or more pipes flowably connecting the heat absorber to the heat sink so as to permit simultaneous flow of the vapor from the heat absorber to the heat sink and of the liquid working fluid from the heat sink to the heat absorber when heat is applied to the heat absorber, wherein the working fluid is a hydrofluorocarbon or a chlorinated hydrofluoroalkene having a normal boiling point in a range from 10° C. to 80° C.

19. The heat pipe system of claim 18, wherein the working fluid has a normal boiling point in a range from 10° C. to 45° C.

20. The heat pipe system of claim 18, wherein the working fluid is a pentafluoropropane.

21. The heat pipe system of claim 18, wherein the working fluid is a hexafluoropropane.

22. The heat pipe system of claim 18, wherein the working fluid is a pentafluorobutane.

23. The heat pipe system of claim 18, wherein the working fluid is a mono-chloro trifluoropropene with both low ozone-depletion potential and low global-warming potential.

24. The heat pipe system of claim 18, wherein the working fluid is selected from the group consisting of HFC-245fa, HFC-245ca, HFC-236ca, HFC-365mfc, HCFC 1233zd, HCFC 1233xf, and mixtures thereof.

25. A cooling method, comprising:
causing a liquid working fluid to flow through a plurality of microchannels each having a cross-sectional dimension to a center of that microchannel that is about equal to or less than a thermal boundary layer thickness for the working fluid,
causing at least some of the working fluid to form a vapor and absorb heat at a first location,
receiving and condensing the working fluid vapor to discharge heat from the fluid at a second location and reform the liquid working fluid, and
continuously returning the condensed working fluid from the second location to the first location.

26. The method of claim 25, wherein the step of causing the working fluid to form a vapor takes place in the microchannels.

27. The method of claim 25, wherein the step of condensing takes place in the microchannels.

28. The method of claim 25, wherein the working fluid is conveyed substantially only passively.

29. The heat pipe system of claim 13, wherein the number of layers is from 2 to 10.

30. The heat pipe system of claim 18, wherein the number of layers is from 2 to 10.

31. The method of claim 25, wherein the number of layers is from 2 to 10.

32. The method of claim 25 wherein the step of causing a liquid working fluid to flow through a plurality of layers of microchannels causes a laminar flow in the microchannels.

33. The heat pipe of claim 1 wherein the microchannel heat absorber is constructed to operate with a laminar flow.

34. The system of claim 13 wherein the microchannel heat absorber is constructed to operate with a laminar flow.

35. The system of claim 18 wherein the microchannel heat absorber is constructed to operate with a laminar flow.

36. The heat pipe of claim 1 wherein the microchannel heat absorber defines a plurality of layers of microchannels.

37. The heat pipe of claim 13 wherein the microchannel heat absorber defines a plurality of layers of microchannels.

38. The heat pipe system of claim 18 wherein the microchannel heat absorber defines a plurality of layers of microchannels.

39. The method of claim 25 wherein the step of causing a liquid working fluid to flow through a plurality of microchannels causes the liquid working fluid to flow through a plurality of layers of microchannels.

40. The heat pipe of claim 1 wherein the microchannel heat absorber defines the microchannels to have a cross-sectional dimension of less than 1000 microns.

41. The heat pipe of claim 13 wherein the microchannel heat absorber defines the microchannels to have a cross-sectional dimension of less than 1000 microns.

42. The heat pipe of claim 18 wherein the microchannel heat absorber defines the microchannels to have a cross-sectional dimension of less than 1000 microns.

43. The method of claim 25 wherein the step of causing a liquid working fluid to flow through a plurality of microchannels causes the liquid working fluid to flow through channels that have a cross-sectional dimension of less than 1000 microns.

44. The heat pipe of claim 36 wherein the plurality of layers includes
   a) a first microchannel heat absorber layer comprising at least one layer defining a plurality of microchannels each having a cross-sectional dimension of less than 1000 microns and terminating at a first end thereof in a first cool side manifold portion and at a second end thereof in a first warm side manifold portion, the microchannels adapted to contain a liquid working fluid that absorbs heat and forms a vapor upon flowing therethrough from the first end to the second end, and
   b) at least a second microchannel heat absorber layer stacked on and in thermal communication with the first microchannel heat absorber layer comprising at least one layer defining a plurality of microchannels having a cross-sectional dimension of less than 1000 microns and terminating at a first end thereof in a second cool side manifold portion and at a second end thereof in a second warm side manifold portion, the microchannels adapted to contain the liquid working fluid that absorbs heat and forms a vapor upon flowing therethrough from the first end to the second end.

45. The heat pipe of claim 44, wherein the first microchannel heat absorber layer a) and the at least second microchannel heat absorber layer b) are parallel flow microchannel heat absorber layers.

46. The heat pipe of claim 44, wherein the first microchannel heat absorber layer a) and the at least second microchannel heat absorber layer b) are cross-flow microchannel heat absorber layers.

47. The heat pipe of claim 1 wherein the microchannel layer, heat sink, and pipes are constructed and adapted to passively convey at least some of the liquid from the heat sink to the heat absorber independent of any pumping or wicking.

* * * * *